United States Patent
Lee et al.

(10) Patent No.: US 8,524,521 B2
(45) Date of Patent: Sep. 3, 2013

(54) METHOD FOR MAKING WAFER LEVEL IMAGE MODULE

(75) Inventors: Hsiao-Wen Lee, Hsinchu (TW); Pai-Chun Peter Zung, Hsinchu (TW); Tzu-Han Lin, Hsinchu (TW)

(73) Assignees: VisEra Technologies Company Limited, Hsinchu (TW); OmniVision Technologies, Inc., Santa Clara, CA (US)

( * ) Notice: Subject to any disclaimer, the term of this patent is extended or adjusted under 35 U.S.C. 154(b) by 406 days.

(21) Appl. No.: 12/539,309

(22) Filed: Aug. 11, 2009

(65) Prior Publication Data

US 2009/0294639 A1    Dec. 3, 2009

Related U.S. Application Data

(62) Division of application No. 11/528,461, filed on Sep. 28, 2006, now Pat. No. 7,592,680.

(30) Foreign Application Priority Data

Sep. 29, 2005  (TW) ............................. 94134100 A

(51) Int. Cl.
    *H01L 21/00* (2006.01)
(52) U.S. Cl.
    USPC ............... 438/57; 438/14; 257/E21.525
(58) Field of Classification Search
    USPC ........... 438/15, 57, 14, 16, 48; 257/E21.525
    See application file for complete search history.

(56) References Cited

U.S. PATENT DOCUMENTS

| | | | |
|---|---|---|---|
| 4,588,261 A | 5/1986 | Erhardt | |
| 5,500,540 A * | 3/1996 | Jewell et al. | 257/82 |
| 5,514,888 A | 5/1996 | Sano et al. | |
| 6,297,876 B1 * | 10/2001 | Bornebroek | 355/67 |
| 6,753,557 B2 | 6/2004 | Nakai | |
| 6,900,429 B1 | 5/2005 | Bai et al. | |
| 2002/0179813 A1 * | 12/2002 | Baer | 250/201.2 |
| 2004/0094695 A1 | 5/2004 | Chen | |
| 2005/0067681 A1 | 3/2005 | De Villeneuve et al. | |
| 2005/0077458 A1 * | 4/2005 | Ma et al. | 250/239 |
| 2005/0110889 A1 | 5/2005 | Tuttle et al. | |
| 2005/0236684 A1 * | 10/2005 | Chen et al. | 257/433 |
| 2006/0044450 A1 * | 3/2006 | Wolterink et al. | 348/340 |
| 2012/0018764 A1 * | 1/2012 | Choi et al. | 257/99 |

FOREIGN PATENT DOCUMENTS

| | | |
|---|---|---|
| CN | 1135660 | 11/1996 |
| EP | 1244151 | 9/2002 |
| JP | 10/173860 | 6/1998 |
| JP | 2001/218090 | 8/2001 |
| KR | 2002/0088364 | 11/2002 |
| TW | I229498 | 3/2005 |
| WO | WO-2004/027880 | 4/2004 |
| WO | WO-2005/031422 | 4/2005 |
| WO | WO-2005/071445 | 8/2005 |
| WO | WO-2005/093826 | 10/2005 |

* cited by examiner

*Primary Examiner* — Kimberly Rizkallah
*Assistant Examiner* — Duy T Nguyen
(74) *Attorney, Agent, or Firm* — Muncy, Geissler, Olds & Lowe, PLLC

(57) ABSTRACT

A wafer level image module includes a photo sensor for outputting an electrical signal upon receiving light, a lens set for focusing incident light onto the photo sensor, and an adjustment member disposed between the photo sensor and the lens set for controlling the distance between the photo sensor and the lens set to compensate the focus offset of the photo sensor for enabling the lens set to accurately focus the incident light onto the photo sensor in an in-focus manner so as to provide a high image quality.

8 Claims, 7 Drawing Sheets

METHOD FOR MAKING WAFER LEVEL IMAGE MODULE

CROSS REFERENCE TO RELATED APPLICATIONS

This application is a Divisional of application Ser. No. 11/528,461, filed on Sep. 28, 2006, which issued as U.S. Pat. No. 7,592,680 on Sep. 22, 2009, and for which priority is claimed under 35 U.S.C. §120; and this application claims priority of Application No. 094134100 filed in Taiwan, R.O.C. on Sep. 29, 2005 under 35 U.S.C. §119; the entire contents of all of which are hereby incorporated by reference.

BACKGROUND OF THE INVENTION

1. Field of the Invention

The present invention relates to image modules and more particularly, to a wafer level image module, the method for making the same and the apparatus for assembling and testing the same.

2. Description of the Related Art

FIG. 12 shows a conventional CMOS (Complementary Metal-Oxide Semiconductor) image module 80. According to this design, the CMOS image module 80 comprises a sensor chip 82 and a lens holder 81 covering the sensor chip 82. The lens holder 81 comprises a rotary lens barrel 83, and a lens set 84 on the center of the rotary lens barrel 83. When the lens set 84 is mapping an image onto the sensor chip 82, the rotary lens barrel 83 is rotatable to change the distance between the lens set 84 and the sensor chip 82, thereby focusing light rays on the sensor chip 82.

FIG. 13 shows an image module according to WO2004/027880. This design of image module comprises an image pickup device 103 and a set of lenses 111 and 127. The lenses 111 and 127 are arranged in a stack and closely attached to the image pickup device 103 to map the image of incident light rays onto the image pickup device 103. The main feature of this patent is that the image pickup device 103 and the lenses 111 and 127 are made through an integrated circuit manufacturing process to minimize the size for use in a cell phone, PDA, or any of a variety of other consumer electronics.

However, during the fabrication of the image module according to WO2004/027880, the lenses 111 and 127 may deform by the manufacturing process and the manufacturing temperature. The focal distance of the finished product shows a 0-50 μm error when compared to the original theoretical design. In actual practice, the lenses 111 and 127 cannot accurately focus the image of incident light rays onto the image pickup device 103, resulting in an out-of-focus problem (see the imaginary line A or B in FIG. 13). Further, when mounting the lenses 111 and 127 on the image pickup device 103, the respective size tolerance, for example, 0-20 μm thickness tolerance of each glass chip makes distance control between the lenses 111 and 127 and the image pickup device 103 difficult, resulting in inaccurate focusing of the lenses 111 and 127 on the image pickup device 103.

SUMMARY OF THE INVENTION

The present invention has been accomplished under the circumstances in view. It is an objective of the present invention to provide a wafer level image sensor, which has adjustment means to compensate focus offset, thereby improving the image mapping quality.

It is another objective of the present invention to provide a wafer level image sensor assembly apparatus, which allows in-situ adjustment and test of each assembled wafer level image sensor, assuring a high quality of each assembled wafer level image sensor.

It is still another objective of the present invention to provide a wafer level image sensor assembly method, which is practical to assemble high quality wafer level image sensors.

To achieve these objectives of the present invention, the wafer level image module comprises a photo sensor, a lens set, and an adjustment member. The photo sensor outputs an electrical signal when induced by light. The lens set maps the image of incident light rays onto the photo sensor. The adjustment member is set between the photo sensor and the lens set to control the distance between the photo sensor and the lens sent, and to compensate the focus offset of the photo sensor, enabling the lens set to accurately focus the image of incident light rays onto the photo sensor.

The method for making a wafer level image module comprises the steps of a) providing a photo sensor, b) stacking a lens set on the photo sensor, c) measuring a focus offset of the lens set, and d) disposing an adjustment member between the lens set and the photo sensor to compensate the focus offset of the lens set so as to have the photo sensor be in an in-focus status.

The present invention also provides an apparatus for in-situ assembling and testing the aforesaid wafer level image module. The apparatus comprises a positioning unit for positioning the photo sensor on the lens set and for setting the adjustment member between the photo sensor on the lens set, a signal pickup device electrically connected to the photo sensor for picking up a signal from the photo sensor upon focusing of an image onto the photo sensor by the lens set, a signal processor electrically connected to the signal pickup device for determining in-focus or out-of-focus status of the image focusing on the photo sensor, and a bonding unit for bonding the photo sensor, the adjustment member and the lens set together.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWING

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENT

Figure 1:
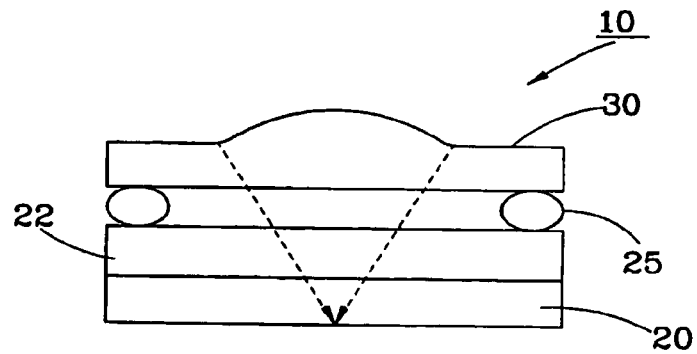
FIG. 1 is a schematic sectional view of a wafer level image module in accordance with a first preferred embodiment of the present invention.

As shown in FIG. 1, a wafer level image module 10 in accordance with a first preferred embodiment of the present invention comprises a photo sensor 20, an adjustment member 25, and a lens set 30. The photo sensor 20 can be a CMOS (Complementary Metal-Oxide Semiconductor) image sensor or CCD (Charge Coupled Device) image sensor adapted to output an electrical signal when induced by light. The photo sensor 20 is mounted on the top side thereof with a light transmissive spacer 22. The light transmissive spacer 22 protects the photo sensor 20 against outside pollutants and moisture. The adjustment member 25 can be a glass ball spacer 25 or fiber spacer formed on the top surface of the transmissive spacer 22 by sputtering deposition, spot adhesive, or screen printing. The adjustment member 25 has a thickness about 1-50 μm. This thickness is determined subject to the depth of focus required and the focus offset. Further, the adjustment member 25 can be formed on the transmissive spacer by means of thick film photolithography technology, or directly made of a glass plate. Alternatively, the adjustment member 25 can be formed on the lens set 30.

The lens set 30 can be molded from transparent ultraviolet polymers, or made by etching. The lens set 30 is covered on the top side of the adjustment member 25 such that the adjustment member 25 is sandwiched between the lens set 30 and the photo sensor 20 for controlling the distance between the lens set 30 and the photo sensor 20. Incident light rays go through the lens set 30 to the photo sensor 20, thereby mapping the image onto the photo sensor 30. The focus offset in which the lens set 30 maps the image of incident light rays onto the photo sensor 20 is about 0-50 μm. When setting the adjustment member 25 in between the lens set 30 and the photo sensor 20, the thickness of the adjustment member 25 compensates the focus offset, thereby controlling the precision of the focal distance of the lens set 30 within the desired depth of focus. For an image module of FNO equal to 2.8 and pixel size 3.6 μm, the focus precision is about 10 μm. By means of the adjustment member 25 to compensate light rays, incident light rays are accurately focused on the photo sensor 20.

When making the aforesaid wafer level image module 10, an assembly apparatus 40 is used for in-situ assembly and in-situ test of wafer level image modules 10. The structure of this assembly apparatus 40 is outlined hereinafter with reference to FIGS. 2 through 4.

Figure 2:
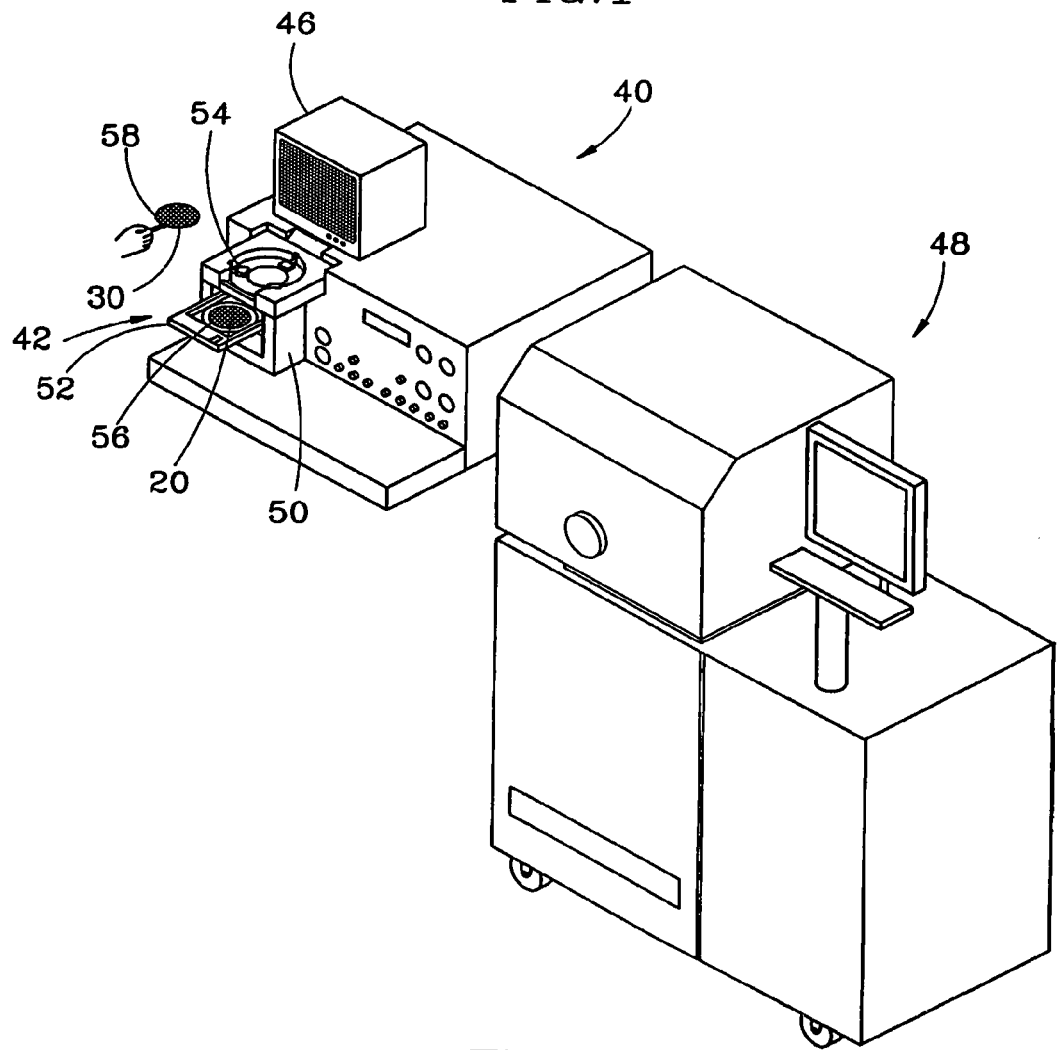
FIG. 2 is a perspective view of a wafer level image module assembly apparatus according to the present invention.
Figure 3:
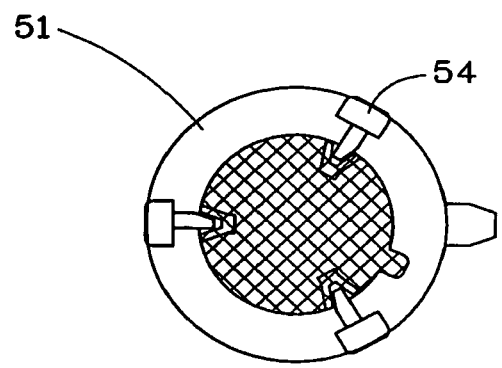
FIG. 3 is a schematic view showing the clamping device clamped the stacked first water and the second wafer on the test table.
Figure 4:
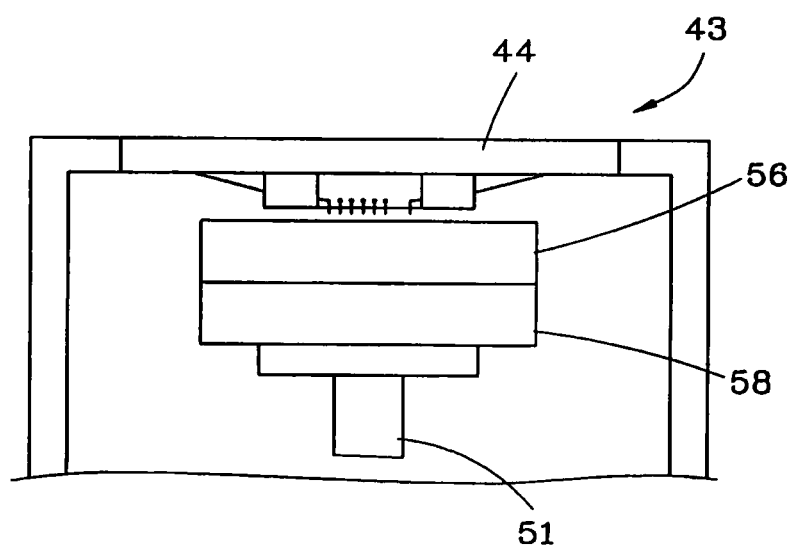
FIG. 4 is a schematic side view showing the first water and the second wafer stacked together and placed on the test table.

As illustrated in FIGS. 2-4, the assembly apparatus 40 comprises a positioning unit 42, a signal pickup device 43, a signal processor 46, and a bonding unit 48. The positioning unit 42 comprises a base 50 and a test table 51. The base 50 supports a sliding carrier 52 and a clamping device 54. The sliding carrier 52 is movable in and out of the base 50 to carry wafer level image modules 10. The clamping device 54 is adapted to hold wafer level image modules 10 in position and to place wafer level image modules 10 on the test table 51. The signal pickup device 43 comprises a probe card 44. The signal pickup device 43 is mounted in the base 50 of the positioning unit 42. The signal processor 46 is electrically connected to the signal pickup device 43, and adapted to check in-focus or out-of-focus status of the image signal picked up from wafer level image modules 10. The bonding unit 48 is adapted to bond the photo sensor 20, adjustment member 25 and lens set 30 of wafer level image modules 10.

The assembly process of the wafer level image module 10 by the assembly apparatus 40 includes the following steps.

Step I: Perform an integrated circuit manufacturing process to prepare a first wafer 56. As shown in FIG. 2, the first wafer has a plurality of photo sensors 20 each carrying a first alignment mark (not shown).

Step II: Perform an integrated circuit manufacturing process to prepare a second wafer 58, which has a plurality of lens sets 30 each carrying a second alignment mark (not shown).

Step III: Place the first water 56 in the sliding carrier 52 of the assembly apparatus 40 and then stack the second wafer 58 on the first wafer 56 to have the second alignment marks of the lens sets 30 in alignment with the first alignment marks of the photo sensors 20 respectively, and then, as shown in FIG. 3, use the clamping device 54 to pre-bond the first wafer 56 and the second wafer 58 and to place the stacked first water 56 and second wafer 58 on the test table 51 to have the photo sensors 20 correspond to the probe card 44.

Step IV: Control the test table 51 to electrically connect the stacked first water 56 and second wafer 58 to the probe card 44, as shown in FIG. 4. The test table 50 can move the stacked wafers 56 and 58 horizontally or tilt the stacked first water 56 and the second wafer 58 subject to test requirements.

Figure 5:
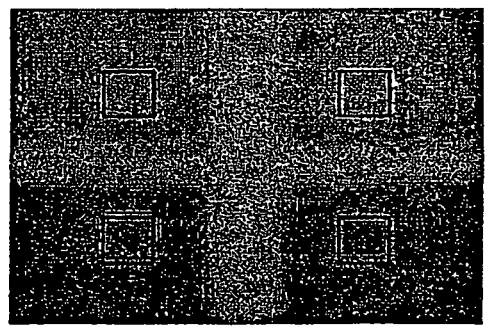
FIG. 5 is a schematic drawing showing an out-of-focus status of an image mapped on the photo sensor according to the present invention.

Step V: Operate the signal processor 46 to receive electrical signal from the signal pickup device 43 so as to obtain the focus offset in which the respective lens sets 30 map the image of incident light rays onto the respective photo sensors 20 for determining in-focus or out-of-focus status of the photo sensors 20 (see FIG. 5) and discriminating far coal or near focal status in case of out-of-focus status.

Figure 6:
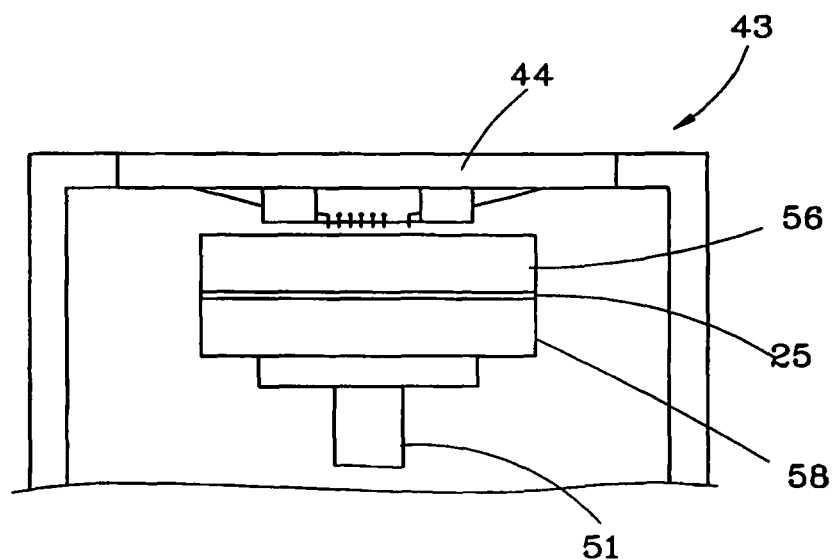
FIG. 6 is similar to FIG. 4, showing the adjustment member set in between the first wafer (photo sensors) and the second wafer (lens sets)

Step VI: Move the sliding carrier 52 out of the base 50, and then apply the prepared adjustment member 25 to the first wafer 56 and the second wafer 58 to have the adjustment member 25 be sandwiched between the lens sets 30 and the photo sensors 20, as shown in FIG. 6, and then electrically connect the integrated wafer level image modules of the stack of wafers 56 and 58 and adjustment member 25 to the probe card 44.

Figure 7:
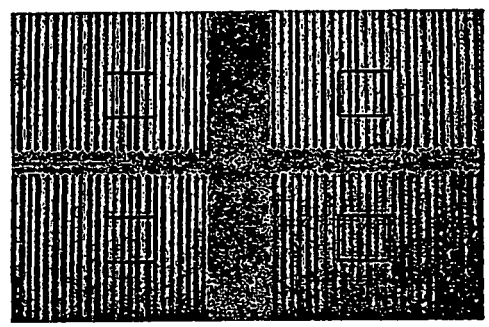
FIG. 7 is a schematic drawing showing an image mapped onto the photo sensor after installation of the adjustment member in the wafer level image module according to the present invention.
Figure 8:
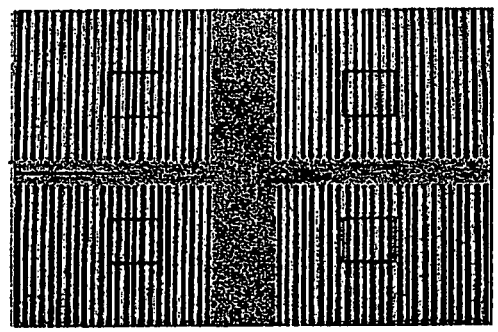
FIG. 8 is schematic drawing showing an in-focus status of an image mapped on the photo sensor according to the present invention.

Step VII: Repeat the aforesaid steps IV through VI if the improved image, as shown in FIG. 7, produced by the photo sensors 20 still lightly shows an out-of-focus status till the in-focus status shown in FIG. 8 where the adjustment member 25 accurately compensates the focus offset.

Step VIII: Operate the clamping device 54 to hold tight the first wafer 56 and the second wafer 58, and then operate the bonding unit 48 to bond the first wafer 56, the adjustment member 25 and the second wafer 58 together.

Step IX: Cut the stacked wafers 56 and 58 and adjustment member 25 into single chips, i.e., individual wafer level image modules 10.

When the lens sets 30 of the second wafer 58 are stacked on the photo sensors 20 of the first wafer 56 by means of the aforesaid assembly apparatus 40 and the aforesaid assembly process, the signal processor 46 is used to check in-focus or out-of-focus status of the electrical signal received from the signal pickup device through the photo sensors 20. If the photo sensors 20 are at an out-of-focus status, the thickness of the adjustment member 25 is adjusted to correct the out-of-focus status of the photo sensors 20 to an in-focus status, assuring image quality of the assembled wafer level image modules 10. Further, by means of changing the thickness of the adjustment member 25, the distance between the respective lens sets 30 and the respective photo sensors 20 is relatively adjusted, thereby accurately compensating the focus offset between the respective lens sets 30 and the respective photo sensors 20 so that the respective lens sets 30 accurately focus light rays onto the respective photo sensors 20.

As stated above, the invention uses the structure of the adjustment member to have the wafer level image module provide a better image quality.

Figure 9:
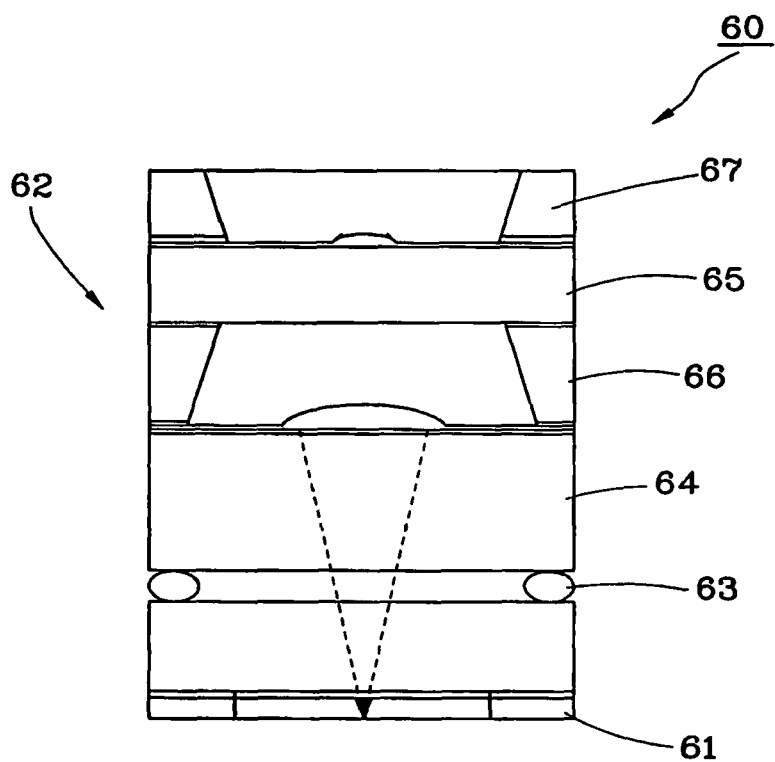
FIG. 9 is a schematic sectional view of a wafer level image module in accordance with a second preferred embodiment of the present invention.

FIG. 9 shows a wafer level image module 60 in accordance with a second embodiment of the present invention. Similar to the aforesaid first embodiment of the present invention, the wafer level image module 60 comprises a photo sensor 61, a lens set 62, and an adjustment member 63 sandwiched between the photo sensor 60 and the lens set 62. The main feature of this second embodiment is that the lens set 62 comprises a first lens layer 64, a second lens layer 65, a first transmissive pad 66 sandwiched between the first lens layer 64 and the second lens layer 65, and a second transmissive pad 67 bonded to the top surface of the second lens layer 65 opposite to the first transmissive pad 66. The first lens layer 64 is bonded to the adjustment member 63 above the photo sensor 61. The first lens layer 64 and the second lens layer 65 are transparent for mapping the image of incident light rays onto the photo sensor 61. This lens set 62 enables the wafer level image module 60 to have more image characteristics.

Figure 10:
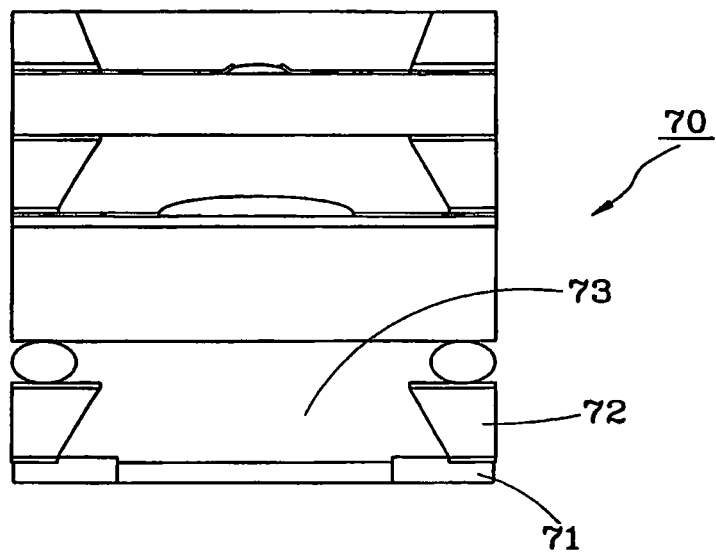
FIG. 10 is a schematic sectional view of a wafer level image module in accordance with a third preferred embodiment of the present invention.

FIG. 10 shows a wafer level image module 70 in accordance with a third embodiment of the present invention. This third embodiment is substantially similar to the aforesaid second embodiment with the exception that the transmissive spacer 72 on the photo sensor 71 has an opening 73 corresponding to the photo sensing area of the photo sensor 71. This third embodiment achieves the same various effects as the aforesaid first and second embodiments of the present invention.

Figure 11:
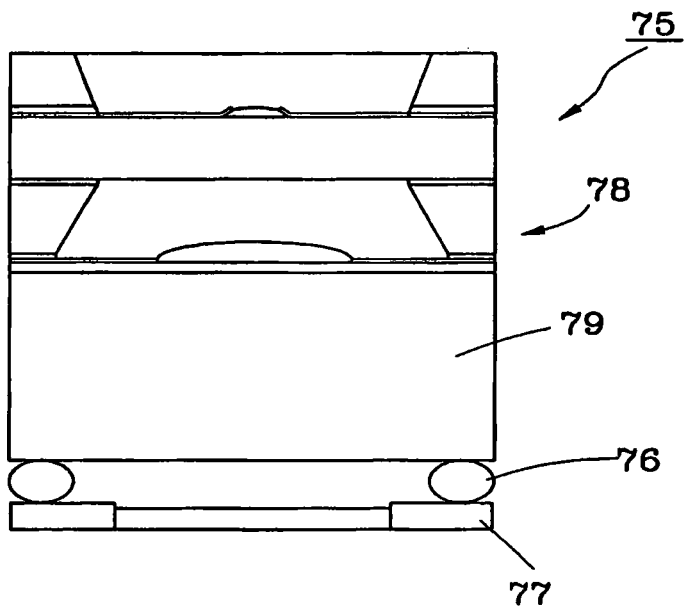
FIG. 11 is a schematic sectional view of a wafer level image module in accordance with a fourth preferred embodiment of the present invention.
Figure 12:
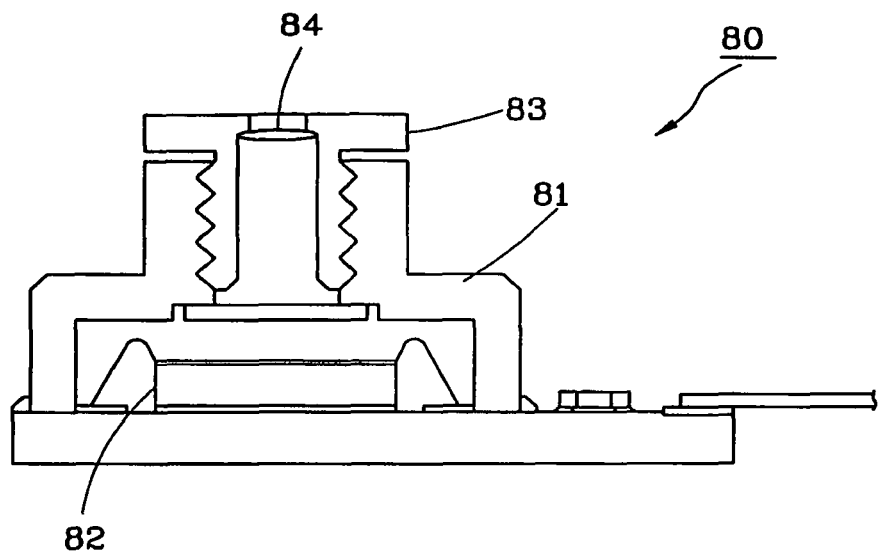
FIG. 12 is a schematic drawing showing an image module according to the prior art.
Figure 13:
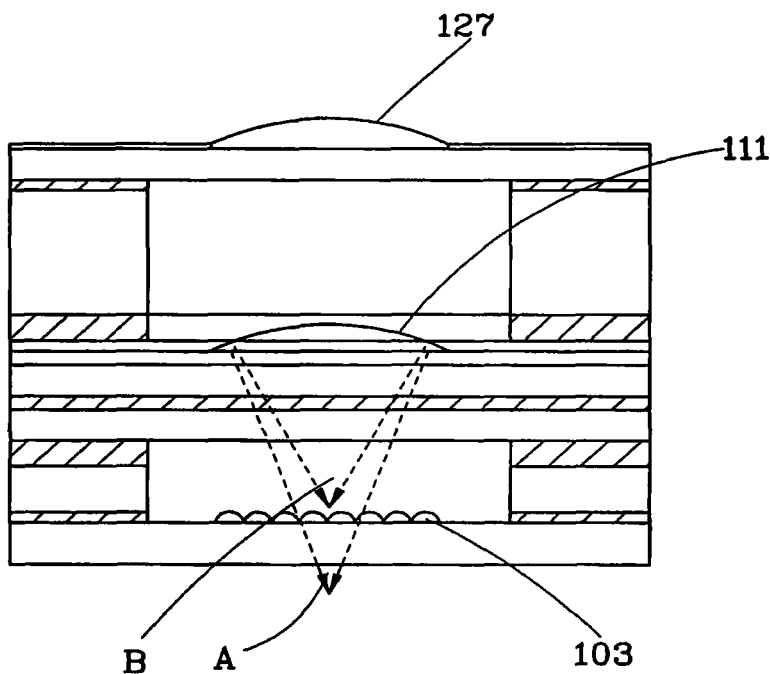
FIG. 13 is a schematic drawing showing another design of image module according to the prior art.

FIG. 11 shows a wafer level image module 75 in accordance with a fourth embodiment of the present invention. According to this fourth embodiment, the adjustment member 76 is directly bonded to the surface of the photo sensor 77, and the first lens layer 79 of the lens set 78 is bonded to the adjustment member 76. This fourth embodiment achieves the same various effects as the aforesaid various embodiments of the present invention.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for making a wafer level image module comprising the steps of:
    a) providing a photo sensor made by an integrated circuit manufacturing process;
    b) stacking a lens set made by an integrated circuit manufacturing process on the photo sensor;
    c) measuring a focus offset of said lens set and determining in-focus or out-of-focus status of said photo sensor;
    d) disposing an adjustment member between said lens set and said photo sensor to compensate the focus offset of said lens set so as to have said photo sensor be in an in-focus status, wherein said adjustment member comprises a glass ball; and
    e) disposing a transparent spacer between said photo sensor and said adjustment member, wherein said transparent spacer is in direct contact with said adjustment member.

2. The method as claimed in claim 1, wherein said step (c) comprises a sub-step of using a signal processor to check the out-of-focus status to be a far focal or near focal status when said photo sensor is in an out-of-focus status.

3. The method as claimed in claim 1, wherein said transparent spacer has an opening corresponding to a photo sensing area of said photo sensor.

4. A method for making a wafer level image module comprising:
    providing a photo sensor;
    molding transparent ultraviolet polymers to form a lens set, stacking a said lens set on said photo sensor;
    measuring a focus offset of said lens set;
    determining a thickness of an adjustment member according to said focus offset;
    bonding said adjustment member between said lens set and said photo sensor;
    confirming a second focus offset of said lens set by a probe card; and
    disposing a transparent spacer between said photo sensor and said adjustment member, wherein said transparent spacer is in direct contact with said adjustment member, wherein said adjustment member comprises a glass ball.

5. The method as claimed in claim 4, further comprising:
    clamping said photo sensor, said adjustment member, and said lens set; and
placing said photo sensor, said adjustment member, and said lens set on a test table.

6. The method as claimed in claim 4, wherein the bonding step comprises:
    holding said photo sensor, said adjustment member, and said lens set together.

7. The method as claimed in claim 4, wherein the measuring step comprises:
    picking up a signal from the photo sensor upon focusing an image onto said photo sensor by the lens set; and
    processing said signal to check in-focus or out-of-focus status of the image.

8. The method as claimed in claim 4, wherein said transparent spacer has an opening corresponding to a photo sensing area of said photo sensor.

* * * * *